(12) United States Patent
Xiao

(10) Patent No.: US 11,044,805 B1
(45) Date of Patent: Jun. 22, 2021

(54) DOUBLE-SIDED TWO-DIMENSIONAL CODING, MANUFACTURING METHOD THEREOF, AND FLEXIBLE PRINTED CIRCUIT

(71) Applicant: TRIPLE WIN TECHNOLOGY(SHENZHEN) CO.LTD., Shenzhen (CN)

(72) Inventor: Hao-Yang Xiao, Shenzhen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 0 days.

(21) Appl. No.: 16/896,439

(22) Filed: Jun. 9, 2020

(30) Foreign Application Priority Data

Mar. 27, 2020 (CN) .......................... 202010227707.1

(51) Int. Cl.
| | | |
|---|---|---|
| *H05K 1/02* | (2006.01) | |
| *H05K 3/30* | (2006.01) | |
| *H05K 3/28* | (2006.01) | |
| *H05K 3/46* | (2006.01) | |

(52) U.S. Cl.
CPC .......... *H05K 1/0266* (2013.01); *H05K 1/028* (2013.01); *H05K 3/28* (2013.01); *H05K 3/303* (2013.01); *H05K 3/4644* (2013.01); *H05K 2201/0108* (2013.01); *H05K 2203/107* (2013.01)

(58) Field of Classification Search
CPC ................... H05K 1/0266–0269; H05K 3/303
See application file for complete search history.

(56) References Cited

U.S. PATENT DOCUMENTS

| | | | | |
|---|---|---|---|---|
| 8,766,106 | B2 * | 7/2014 | Noda | ...................... H05K 1/115 174/262 |
| 9,029,709 | B2 * | 5/2015 | Ozaki | ...................... H05K 3/125 174/254 |
| 2016/0274317 | A1 * | 9/2016 | Tsujita | ................. G02B 6/4245 |

* cited by examiner

Primary Examiner — Jeremy C Norris
(74) Attorney, Agent, or Firm — ScienBiziP, P.C.

(57) ABSTRACT

The present disclosure provides a double-sided two-dimensional coding, includes a transparent medium layer on which a metal layer is plated, and a two-dimensional coding image is fused through the metal layer. The present disclosure also provides a flexible printed circuit and manufacturing method for a double-sided two-dimensional coding. By lasering the metal layer corresponding to the transparent medium layer, the metal layer is fused through to form a two-dimensional coding image, and the transparent medium layer is retained as a carrier of the two-dimensional coding image, and an effect of reading the two-dimensional coding on both sides can be achieved.

11 Claims, 4 Drawing Sheets

DOUBLE-SIDED TWO-DIMENSIONAL CODING, MANUFACTURING METHOD THEREOF, AND FLEXIBLE PRINTED CIRCUIT

CROSS-REFERENCE TO RELATED APPLICATIONS

This application claims priority of Chinese Patent Application No. 202010227707.1, filed on Mar. 27, 2020 in the China National Intellectual Property Administration (CNIPA), the entire contents of which are incorporated by reference herein.

FIELD

The embodiments of the present disclosure relate to a technical field of flexible printed circuits, specifically a double-sided two-dimensional coding, a manufacturing method thereof, and a flexible printed circuit.

BACKGROUND

In the production process of products in the electronics industry, products need to be marked for easy tracking. The usual practice is to affix a two-dimensional coding on a flexible printed circuit (FPC) to differentiate products.

In the prior art, whether the two-dimensional coding is printed by ink or printed by laser, there is a common problem that the two-dimensional coding can only be formed on one side of the FPC board. When scanning a two-dimensional coding on the front and back sides of circuits at different stations, the machine needs to be changed, wasting man hours and affecting work efficiency.

DETAILED DESCRIPTION

Figure 1:
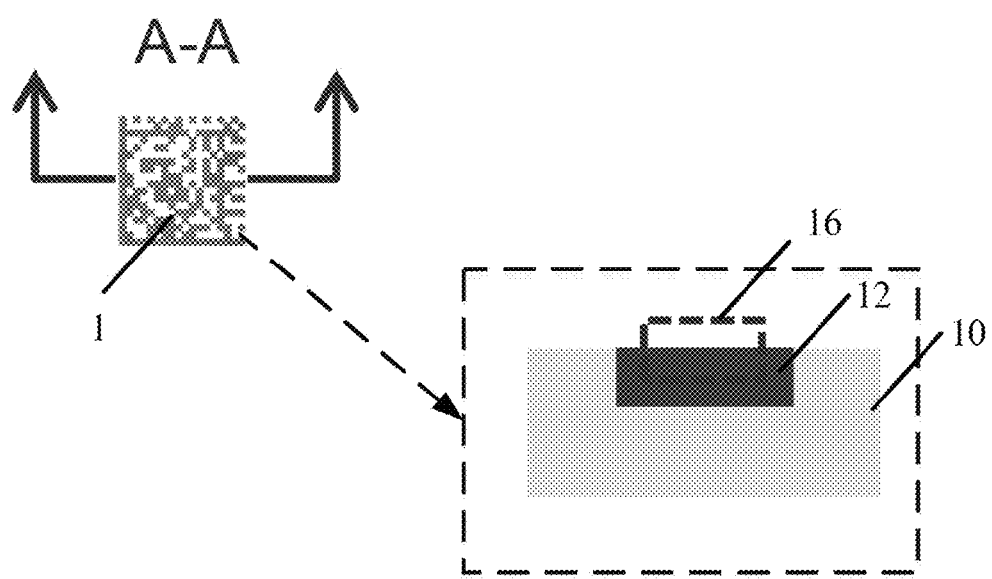
FIG. 1 is a schematic diagram of a double-sided two-dimensional coding of an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Referring to FIG. 1, a left side of FIG. 1 shows a double-sided two-dimensional coding 1, and a right side of FIG. 1 shows a cross-sectional view along line A-A of the double-sided two-dimensional coding 1. The double-sided two-dimensional coding 1 may include, but is not limited to: a transparent medium layer 10 on which a metal layer 12 is plated, and a two-dimensional coding image is fused through the metal layer 12.

The transparent medium layer 10 is a base material of a transparent medium.

In at least one embodiment of the present disclosure, an intermediate area on the metal layer 12 is set as a laser marking area 16. Since the transparent medium layer 10 is below the metal layer 12, the laser marking area 16 in the metal layer 12 is subjected to laser irradiation by a laser device until the metal layer 12 corresponding to the laser marking area 16 melts through, thereby forming a double-sided two-dimensional coding image on the metal layer 12 which is visible from both sides. The two-dimensional coding can thus be read from both the front and back sides.

Information and coding principle of the two-dimensional coding image can be set in advance in the laser device according to actual application situations. Irradiation of the laser marking area 16 in the metal layer 12 is carried out according to the information and coding principle, and the two-dimensional coding image is formed. The two-dimensional coding image contains product information, and the two-dimensional coding image may be composed of letters and numbers.

In at least one embodiment of the present disclosure, the double-sided two-dimensional coding 1 can further include a protective layer (not shown in the figure). The protective layer covers the metal layer 12 and protects the two-dimensional coding image. The protective layer is frosted. The frosted protective layer not only protects the two-dimensional coding image, but also reduces light being reflected on the scanning window of the scanning device to improve a reading success rate of the scanning device in scanning the two-dimensional coding image.

Figure 2:
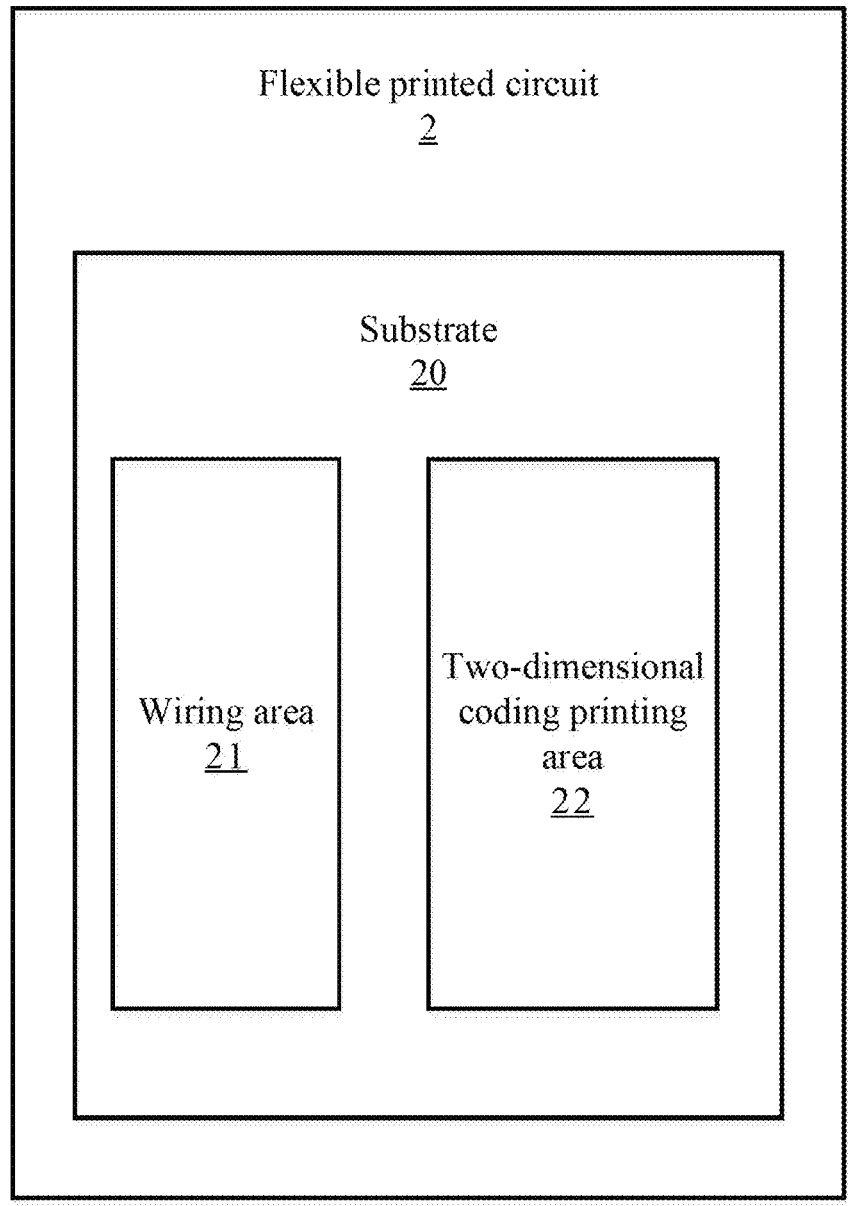
FIG. 2 is a schematic diagram of a flexible printed circuit of a first embodiment of the present disclosure.
Figure 3:
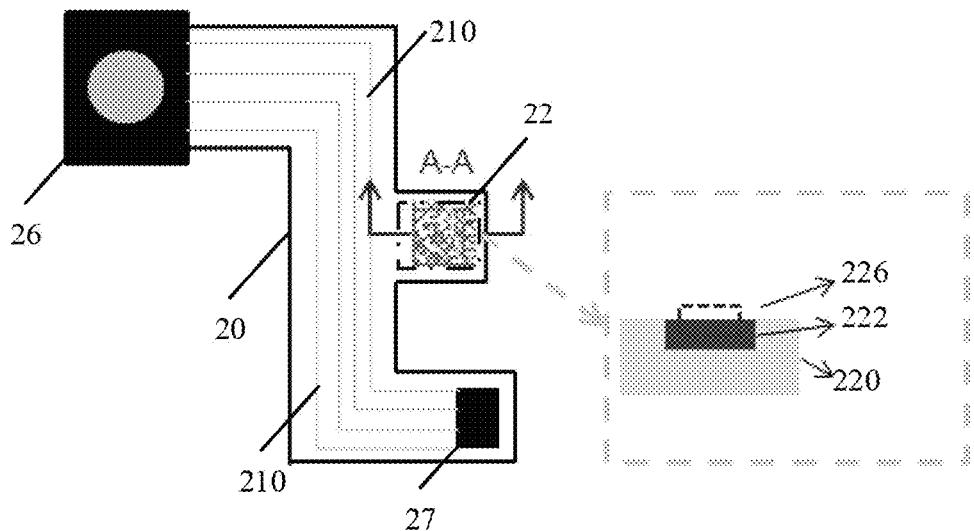
FIG. 3 is a schematic diagram of a flexible printed circuit of a second embodiment of the present disclosure.
Figure 4:
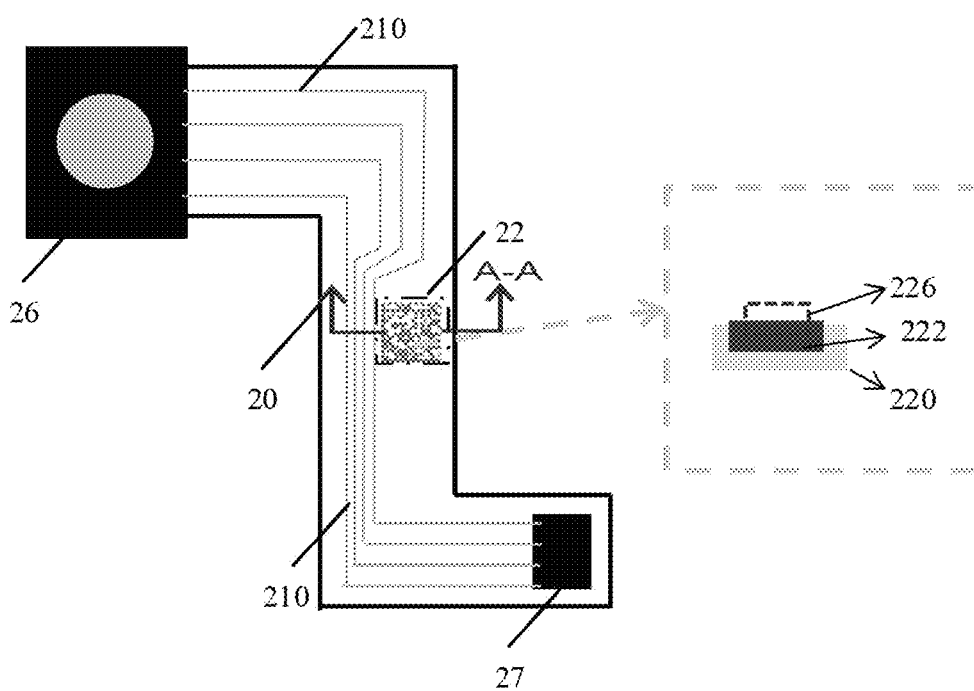
FIG. 4 is a schematic diagram of a flexible printed circuit of a third embodiment of the present disclosure.

Referring to FIG. 2-4, a schematic structural diagram of a flexible printed circuit provided by an embodiment of the present disclosure is shown.

The flexible printed circuit 2 may include, but is not limited to: a substrate 20 on which a wiring area 21 and a two-dimensional coding printing area 22 are provided. A plurality of cable wires 210 are laid on the wiring area 21, and the plurality of cable wires 210 together presenting a flat surface. The two-dimensional coding printing area 22 is used to print a double-sided two-dimensional coding which is visible from both sides.

Since the substrate 20 is black and opaque, if a two-dimensional coding is printed directly on the substrate 20, the two-dimensional coding can only be read from a front side, and cannot be read from a back side. As shown in FIG. 3, a transparent medium layer 220 extends outward from one side of the wiring area 21 on the substrate 20, and the area where the transparent medium layer 220 is located serves as the two-dimensional coding printing area 22. A metal layer 222 is plated on the transparent medium layer 220. Since the transparent medium layer 220 is below the two-dimensional coding printing area 22, the metal layer 222 is irradiated by a laser device to melt the metal layer 222, thereby forming a double-sided two-dimensional coding image on the metal layer 222 which is visible from both sides, and the two-dimensional coding can be read from both the front and back sides.

Although the two-dimensional coding can be read on both sides of the flexible printed circuit 2 shown in FIG. 3, the extension of the two-dimensional coding printing area 22 outward from the substrate 20 increases the area of the entire flexible printed circuit 2. As shown in FIG. 4, a direction of the plurality of cable wires 210 is set so that at least one of the plurality of cable wires 210 forms a bent portion on the wiring area 21. A blank area on the wiring area 21 where the bent portion is located is used as the two-dimensional coding printing area 22. By providing the transparent medium layer 220 on the two-dimensional coding printing area 22, a metal layer 222 is plated on the transparent medium layer 220, and the metal layer 222 is subjected to laser irradiation by a laser device to melt and remove the metal layer 222, thereby forming a double-sided two-dimensional coding image on the metal layer 222. Since the transparent medium layer 220 is below the two-dimensional coding printing area 22, the two-dimensional coding can be read from both the front and back sides. Moreover, the two-dimensional coding printing area 22 can be located in the wiring area 21 without having to increase the area of the flexible printed circuit 2.

In at least one embodiment of the present disclosure, the metal layer 222 defines a laser marking area 226, and the two-dimensional coding image is laser fused through the metal layer 222 where the laser marking area 226 is located. By setting the laser marking area 226, the piercing of the metal layer 222 by laser forms a two-dimensional coding image, the two-dimensional coding image is fixed in a specific area, thereby facilitating a reading of the two-dimensional coding image by a scanning device.

In at least one embodiment of the present disclosure, the metal layer 222 may also be covered with a protective layer (not shown in the figure). The protective layer is frosted. The frosted protective layer not only protects the two-dimensional coding image, but also reduces light being reflected on the scanning window of the scanning device to improve a reading success rate of the scanning device in scanning the two-dimensional coding image.

In at least one embodiment of the present disclosure, the substrate 20 can also provide an optical element 26 and a connecting element 27. The optical element 26 may include a camera, a lens, a collimator, and the like. The connecting element 27 may be a steel sheet.

Figure 5:
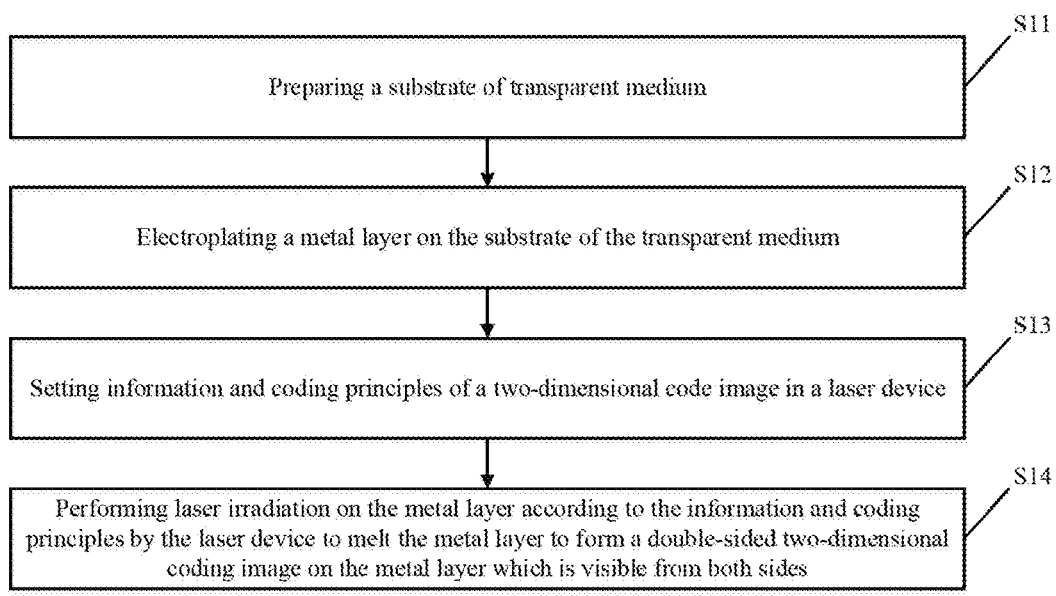
FIG. 5 is a schematic flow chart of a manufacturing method for a double-sided two-dimensional coding of the present disclosure.

Referring to FIG. 5, a flow chart of a manufacturing method for a double-sided two-dimensional coding of the present disclosure is shown. The manufacturing method for a double-sided two-dimensional coding specifically includes the following steps. According to different requirements, an order of the steps in the flowchart may be changed, and some may be omitted.

In block S11, preparing a substrate of transparent medium.

In block S12, electroplating a metal layer on the substrate of the transparent medium.

In block S13, setting information and coding principles of a two-dimensional coding image in a laser device.

In block S14, performing laser irradiation on the metal layer according to the information and coding principles by the laser device to melt the metal layer to form a double-sided two-dimensional coding image on the metal layer which is visible from both sides.

In this embodiment, by using laser marking, the metal layer on the substrate of the transparent medium is melted through, and the substrate retaining the transparent medium is used as the carrier of the two-dimensional coding image, so that reading the two-dimensional coding image from both front and back sides is possible.

In at least one embodiment of the present disclosure, the manufacturing method for a double-sided two-dimensional coding may further include: setting a laser marking area on the metal layer, and irradiating the metal layer corresponding to the laser marking area with the laser device until the metal layer is melted through, to imprint a double-sided two-dimensional coding image on the metal layer which is visible from both sides.

By setting the laser marking area, when a laser device is used to pierce the metal layer to form a two-dimensional coding image, the two-dimensional coding image is fixed in a specific area, and the two-dimensional coding image has a uniform style and a fixed position relative to the entire transparent medium substrate.

In at least one embodiment of the present disclosure, the manufacturing method for a double-sided two-dimensional coding may further include: applying a protective layer to the metal layer.

The protective layer is a frosted surface, and the frosted protective layer not only protects the two-dimensional coding image, but also reduces light being reflected onto the scanning window of the scanning device to improve a reading success rate of the scanning device in scanning the two-dimensional coding image.

The details of the present disclosure are not limited to the above described exemplary embodiments. Other specific forms can be embodied without departing from spirit or essential characteristics of all the present embodiments. The present embodiments are to be considered as illustrative and not restrictive, and scope of the present disclosure is limited by appended claims. All changes in meanings and scopes of equivalent elements are included in all the present disclosure. All accompanying drawings in the claims should not be construed as limiting the claims. In addition, it is to be understood that the word 'comprising' does not exclude other elements or steps, singular or plural. A plurality of units or devices recited in system claims can also be implemented by a unit or a device by software or hardware. The word 'second' is used to denote a name instead of any particular order.

It should be noted that the above embodiments are only for explaining the technical solutions of the present disclosure, and the above embodiments are not intended to be limiting. Although all the present disclosures has been described in detail with reference to preferred embodiments, average technician in the field will understand that modifications or equivalent substitutions may be made without departing from the spirit and the scope of the claims.

I claim:

1. A flexible printed circuit, comprising:
    a substrate;
    a wiring area provided on the substrate;
    a two-dimensional coding printing area provided on the substrate;
    a plurality of cable wires laid on the wiring area, at least one of the plurality of cable wires forms a bent portion on the wiring area;
    the two-dimensional coding printing area comprises a transparent medium layer on which a metal layer is plated, and a two-dimensional coding image is fused through the metal layer, wherein the two-dimensional coding printing area comprises a blank area on the wiring area where the bent portion is located.

2. The flexible printed circuit of claim 1, wherein the two-dimensional coding printing area comprises an area extending outward from one side of the wiring area on the substrate.

3. The flexible printed circuit of claim 1, wherein the plurality of cable wires together presents a flat surface.

4. The flexible printed circuit of claim 1, wherein the metal layer covered a protective layer.

5. The flexible printed circuit of claim 4, wherein the protective layer is a frosted surface.

6. The flexible printed circuit of claim 4, wherein the metal layer defines a laser marking area, and the two-dimensional coding image is laser fused through the metal layer where the laser marking area is located.

7. The flexible printed circuit of claim 6, wherein the substrate defines an optical element.

8. The flexible printed circuit of claim 6, wherein the substrate defines a connecting element.

9. A double-sided two-dimensional coding, comprising:
    a transparent medium layer on which a metal layer is plated;
    a two-dimensional coding image is fused through the metal layer;
    a protective layer covering the metal layer, wherein the protective layer is a frosted surface.

10. A manufacturing method for a double-sided two-dimensional coding as claimed in claim 9, comprising:
    preparing a substrate of transparent medium;
    electroplating a metal layer on the substrate of the transparent medium;
    setting information and coding principles of a two-dimensional coding image in a laser device;
    performing laser irradiation on the metal layer according to the information and coding principles by the laser device to melt the metal layer to form a double-sided two-dimensional coding image on the metal layer which is visible from both sides;
    applying a protective layer to the metal layer, wherein the protective layer is a frosted surface.

11. The manufacturing method for a double-sided two-dimensional coding of claim 10, further comprising:
    setting a laser marking area on the metal layer, and irradiating the metal layer corresponding to the laser marking area with the laser device until the metal layer is melted through, to imprint a double-sided two-dimensional coding image on the metal layer which is visible from both sides.

* * * * *